United States Patent [19]

Lage

[11] Patent Number: 6,100,568

[45] Date of Patent: Aug. 8, 2000

[54] SEMICONDUCTOR DEVICE INCLUDING A MEMORY CELL AND PERIPHERAL PORTION AND METHOD FOR FORMING SAME

[75] Inventor: Craig S. Lage, Austin, Tex.

[73] Assignee: Motorola, Inc., Schaumburg, Ill.

[21] Appl. No.: 08/963,580

[22] Filed: Nov. 6, 1997

[51] Int. Cl.[7] .......................... H01L 27/11; H01L 27/092
[52] U.S. Cl. .................. 257/392; 257/371; 257/903; 257/384
[58] Field of Search .................. 257/371, 392, 257/903

[56] References Cited

U.S. PATENT DOCUMENTS

| | | | |
|---|---|---|---|
| 4,524,377 | 6/1985 | Eguchi | 257/903 |
| 4,553,098 | 11/1985 | Yoh et al. | 257/392 |
| 4,785,341 | 11/1988 | Ning et al. | 257/903 |
| 4,890,141 | 12/1989 | Tang et al. | 257/903 |
| 5,055,904 | 10/1991 | Minami et al. | 257/903 |
| 5,497,021 | 3/1996 | Tada . | |
| 5,536,962 | 7/1996 | Pfiester | 257/392 |

*Primary Examiner*—Gene M. Munson

[57] ABSTRACT

A semiconductor device including a substrate (220) having a primary surface, a memory cell (202) provided on the substrate, the memory cell (202) including a P-channel transistor, the P-channel transistor having an N-type gate (72), and peripheral portion (204) provided on the substrate, the peripheral portion including a P-channel transistor, the P-channel transistor having a P-type gate (99). A method for forming the semiconductor device is also disclosed.

11 Claims, 8 Drawing Sheets

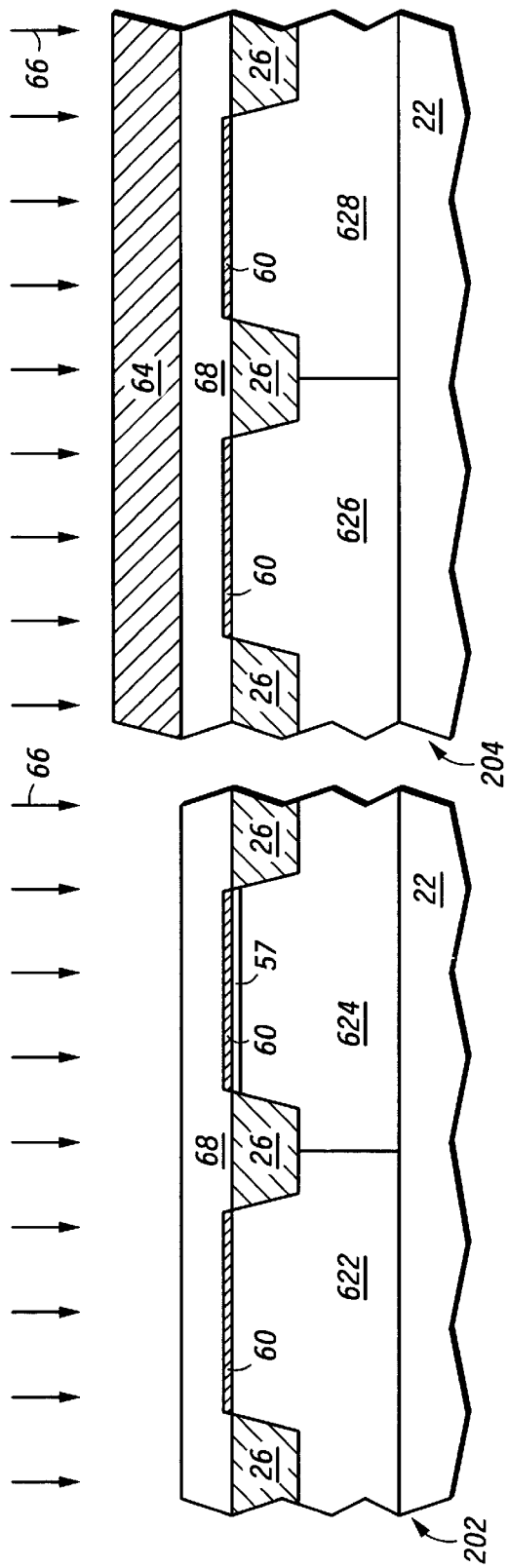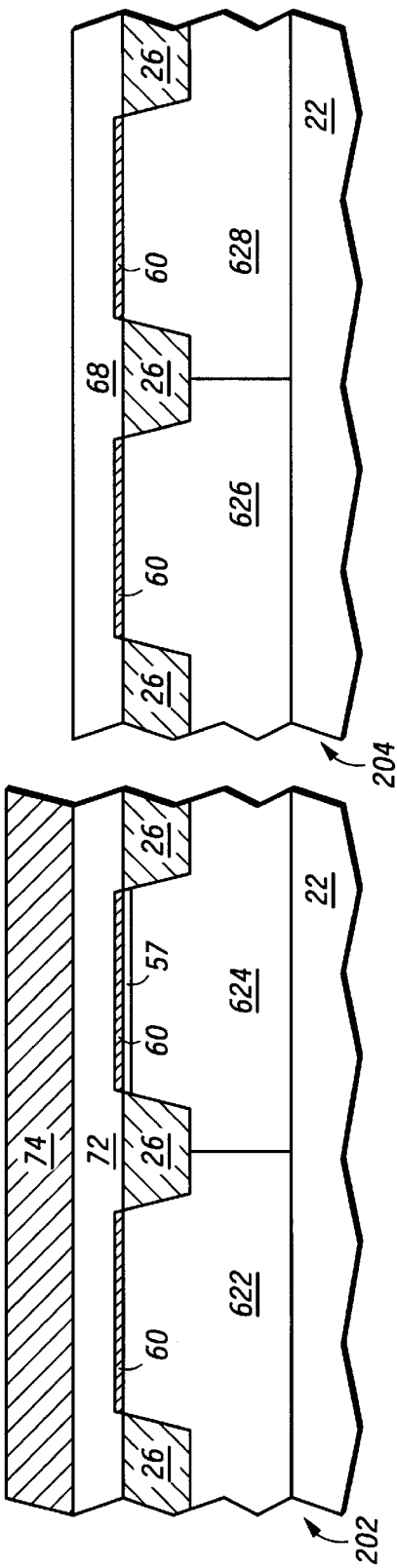

SEMICONDUCTOR DEVICE INCLUDING A MEMORY CELL AND PERIPHERAL PORTION AND METHOD FOR FORMING SAME

FIELD OF THE INVENTION

The present invention is directed to semiconductor devices in general, and more particularly, to a semiconductor device having a memory cell and peripheral portion.

BACKGROUND OF THE INVENTION

Semiconductor devices such as stand alone memories, microprocessors, or microcontrollers typically have a memory array within those devices. In many instances the memory array includes a plurality of static random access memory (SRAM) memory cells. One common design for an SRAM cell is illustrated in FIG. 1. The SRAM cell 10 includes a pair of pass transistors 11 and 12 that are connected to a bit line (BL) and a complementary bit line (BL*). The other portion of transistor 11 is connected to the drains of N-type latch transistor 13 and P-type load transistor 15. The other portion of pass transistor 12 is connected to the drains of N-channel latch transistor 14 and P-channel load transistor 16. As seen in FIG. 1, the gate electrodes of latch transistor 13 and the load transistor 15 are connected to the drains of transistors 14 and 16. Likewise, the gate electrodes of transistors 14 and 16 are connected to the drains of transistors 13 and 15. The sources of transistors 13 and 14 are connected to a $V_{SS}$ electrode, and the sources of the transistor 15 and 16 are connected to a $V_{DD}$ electrode. The gate electrodes for the pass transistors 11 and 12 are part of a word line and are electrically connected to each other. In a semiconductor device, typically the circuitry outside of the memory array includes CMOS logic and sense amplifiers, column decoders, row decoders, buffers, as well as other circuitry.

In a stand alone SRAM memory device, typically all of the gate electrodes are formed using an N+ silicon layer. In this device all of the N-channel transistors will be surface channel transistors and all P-channel transistors will be buried channel transistors. The formation of buried channel transistors typically causes the threshold voltage of such transistors to be higher. The higher operating potential of the P-channel transistors within the peripheral portion typically accrues a time delay for accessing data within the memory and is generally not desired. In microcontroller and microprocessor applications, typically the N+ gates are formed over N-channel transistors and P+ gates are formed over P-channel transistors. Such a layout is generally not preferred in portions of the device that have very tight dimensions, particularly, the memory array portion, as the alignment of the N+ and P+ doping of the same polysilicon layer is difficult to do given small misalignment tolerances.

BRIEF DESCRIPTION OF THE DRAWINGS

FIG. 6 includes an illustration of a cross-sectional view of the substrate of FIG. 5 after doping a silicon layer only within the memory array portion of the semiconductor device.

FIG. 7 includes an illustration of a cross-sectional view of the substrate of FIG. 6 after forming an insulating capping layer over the doped silicon layer within the array portion.

FIGS. 11-1 and 11-2 include illustrations of doping profiles for surface channel and buried channel transistors in accordance with one embodiment of the present invention.

Figure 1:
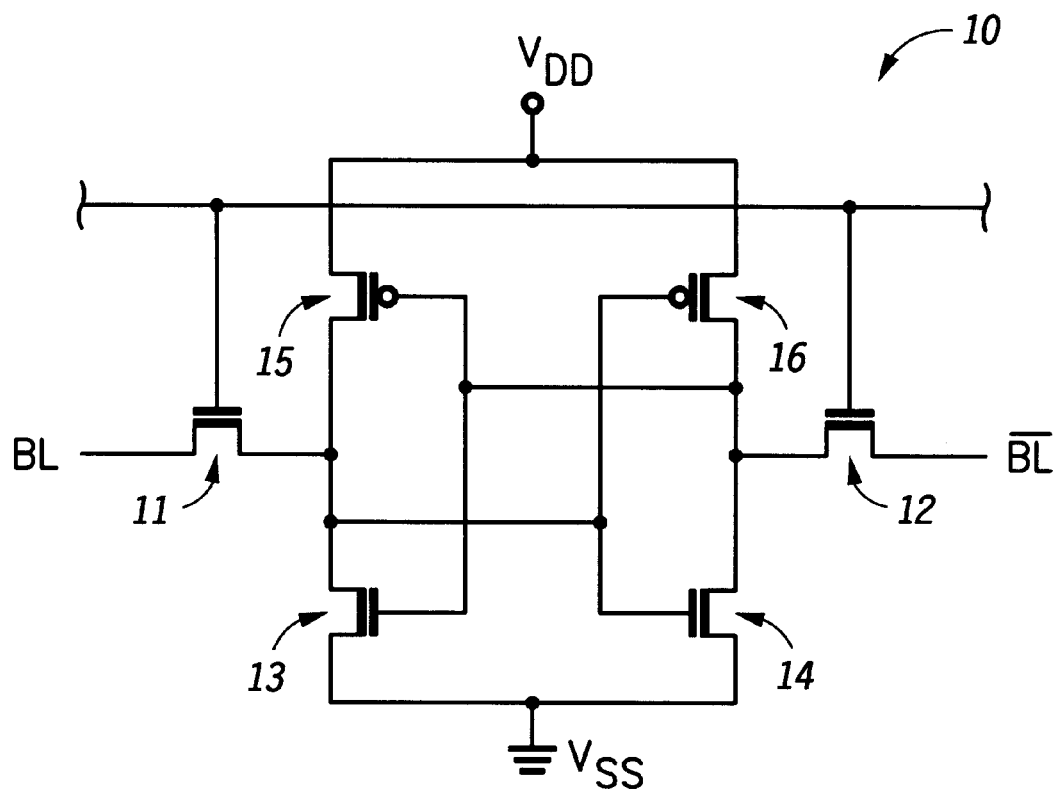
FIG. 1 includes a schematic diagram of a six transistor SRAM cell (prior art).

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 2:
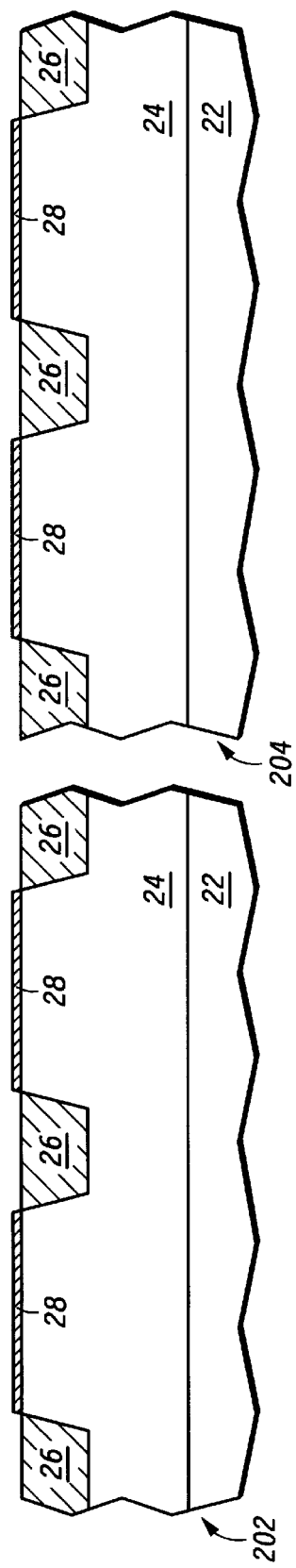
FIG. 2 includes an illustration of a cross-sectional view of a semiconductor device including a memory array and a peripheral portion of the semiconductor device.

FIG. 2 includes an illustration of a cross sectional view of a portion of the semiconductor device including a memory array portion 202 and a peripheral portion 204. Memory cells will be formed within the memory array portion 202. All other circuitry including row decoders, column decoders, sense amplifiers, buffer circuitry and input protection circuitry will be formed within or over portions of the peripheral portion 204. A lightly P-type doped epitaxial layer 24 is formed over a heavily P-type doped monocrystalline semiconductor wafer 22. In other embodiments, the wafer 22 and the epitaxial layer 24, may be replaced by a semiconductor-on-insulator substrate, or any other substrate generally used to form semiconductor devices. The doping concentration of the wafer 22 is typically in a range of approximately 1E18 to 1E20 (i.e., $1 \times 10^{18}$ to $1 \times 10^{20}$) atoms per cubic cm, and the doping concentration within the epitaxial layer 24 is typically in a range of approximately 1E14 to 1E17 atoms per cubic cm. The wafer 22 and the epitaxial layer 24 are typically silicon. The upper surface of the epitaxial layer 24 is the primary surface of the substrate. Field isolation regions 26 are formed over the epitaxial layer 24, and an implant screen layer 28 is then formed over the exposed portions of the epitaxial layer 24. The implant screen layer 28 typically includes oxide, nitride, or a combination thereof. It typically has a thickness less than 500 Å and more usually in a range of approximately 50 Å–200 Å.

Figure 3:
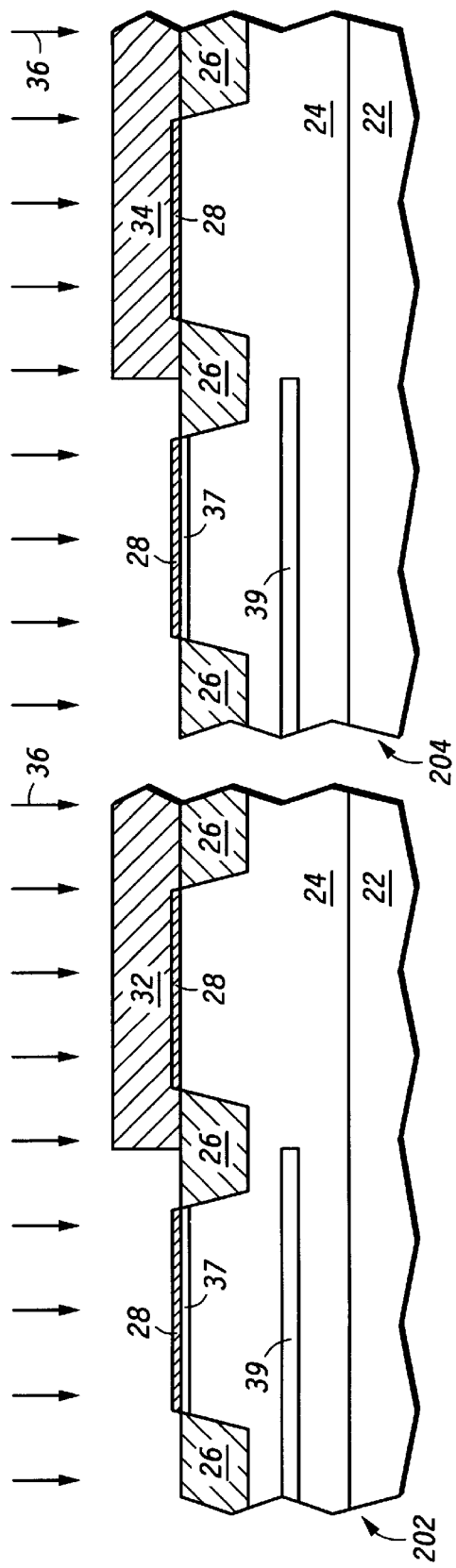
FIG. 3 includes an illustration of a cross-sectional view of the substrate of FIG. 2 after doping portions of the semiconductor device where N-channel transistors will be formed.

A masking layer is then coated over the wafer 22 and patterned to form a masking member 32 that overlies a region of the memory array portion 202 where P-channel transistors will be formed, and masking member 34 is formed over a region of the peripheral portion 204 where P-channel transistors will be formed. Implants for the N-channel transistors are implanted into the substrate as illustrated by arrows 36. In this particular embodiment, the implants form a relatively low resistance bulk P well region 39 and a threshold adjust implant region 37. Typically, the implant for the region 39 is performed at an energy in a range of approximately 100 and 300 kiloelectron volts using boron ions ($B^+_{11}$) to a dose is in range of approximately 1E12 to 1E13 ions per cm². The implant for the threshold adjust implant region 37 is typically performed at an energy in a range of approximately 5–50 kiloelectron volts using boron ions ($B^+_{11}$) to a dose in a range of approximately 1E12 to 1E13 ions per square centimeter. More implants than are shown in FIG. 3 may be performed and may include a punchthrough implant. After this implantation has been performed, the resist members 32 and 34 are removed.

Figure 4:
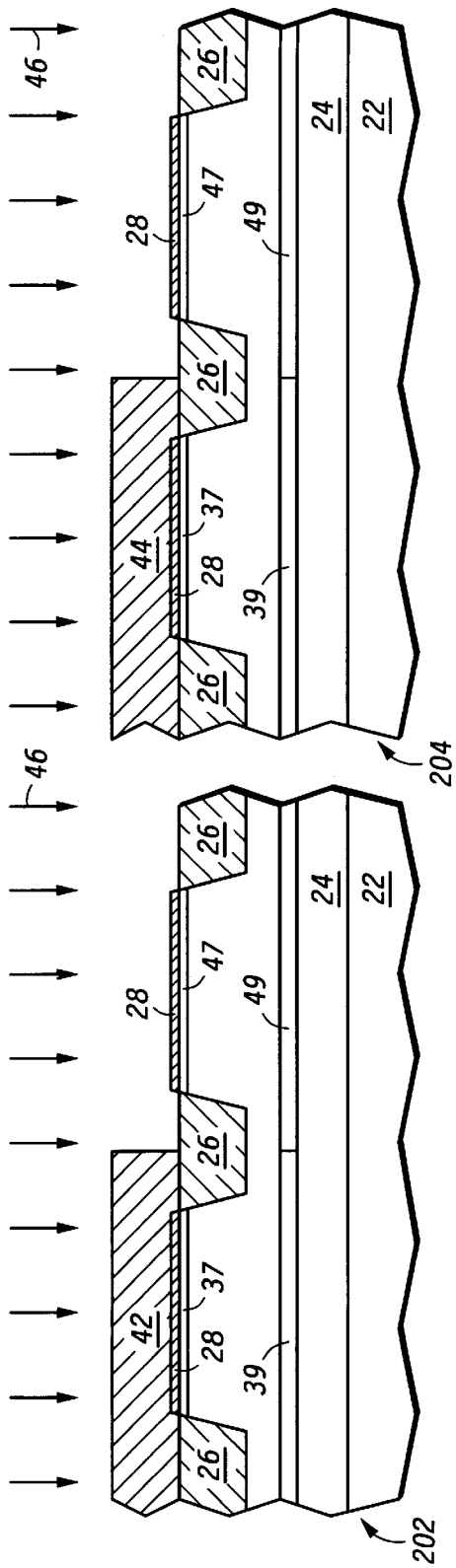
FIG. 4 includes an illustration of a cross-sectional view of the substrate of FIG. 3 after doping portions of the semiconductor device where P-channel transistors will be formed.

Processing is continued to form similar regions of opposite conductivity type for the P-channel transistor regions of portions 202 and 204. As illustrated in FIG. 4, the masking member 42 overlies the N-channel transistor region of the memory array portion 202, and the masking member 44 overlies the N-channel transistor region of peripheral portion 204. Implants similar to those shown in FIG. 3 are performed and are illustrated by arrows 46. Region 49 is the bulk moderately low resistivity region of the N well, and the threshold voltage adjusting region 47 is formed near the surface. The doses and energies are in a range similar to those described for the prior implants except the doping species is phosphorous ions ($P^+_{31}$) instead of boron ions ($B^+_{11}$).

Figure 5:
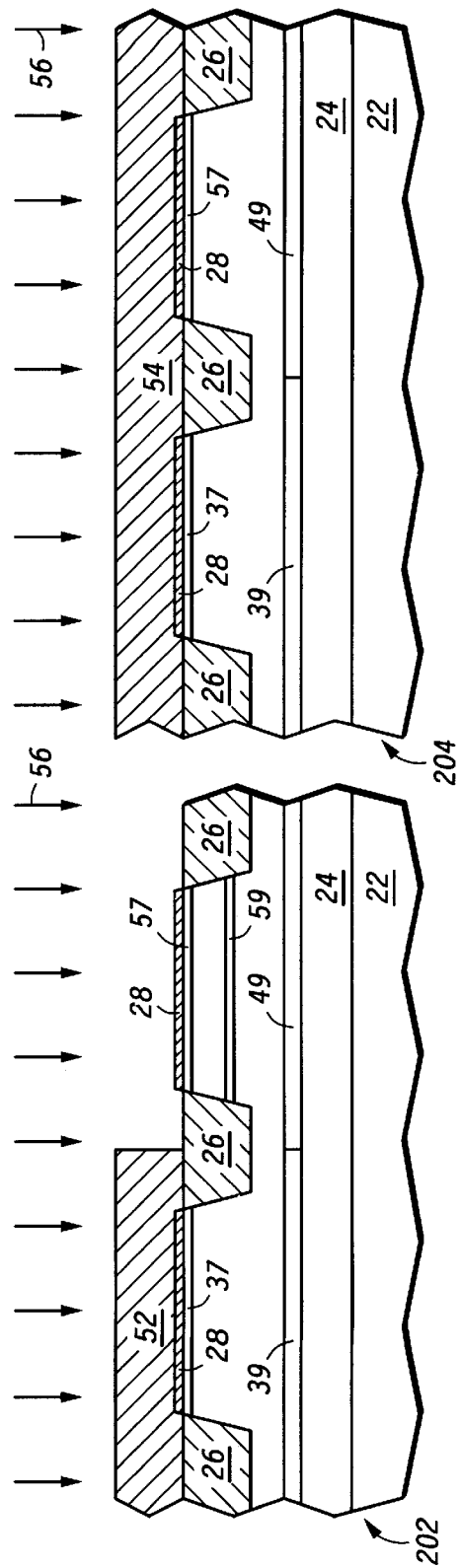
FIG. 5 includes an illustration of a cross-sectional view of the substrate of FIG. 4 after performing an implantation step that is performed for the PMOS transistors only within the memory array portion in accordance with an embodiment of the present invention.

An additional implanting step is used to form a depletion region for the P-channel transistors within the memory array portion 202 as shown in FIG. 5. A masking layer is coated and patterned to form masking members 52 and 54. Masking member 52 covers the N-channel transistor regions of the memory array portion 202 and the masking member 54 covers all of the peripheral portion 204. The implantation is performed as illustrated with arrows to form implant regions, including a punchthrough region 59 and a surface channel region 57, the surface channel region forming a depletion implant region. The punchthrough region 59 is performed using ions of arsenic, antimony or the like at an energy in a range of approximately 50–300 kiloelectron volts to a dose of 1E12 to 1E13 ions per square centimeter. The depletion implant is performed using boron at an energy in a range of 5–50 kilo electron volts at a dose of approximately of 1E12 to 1E13 ions per square centimeter. In an alternative embodiment, but not illustrated, the masking member 42 will cover the array P-channel devices. In this embodiment, the arrows 56 would indicate implants that introduce well region 49 as well as punchthrough region 59 and surface channel region 57. This embodiment would allow independent adjustment of the array P-channel and the peripheral P-channel regions.

A gate dielectric layer 60 is formed over the memory array portion 202 and the peripheral portion 204 as shown in FIG. 6. A semiconductor layer 68 is then formed by deposition over the gate dielectric layer 60 in the memory array portion 202 and the peripheral portion 204. The gate dielectric layer 60 typically is formed by thermally growing the gate dielectric layer or by depositing one or more insulating films. The electrically measured oxide equivalent thickness of the gate dielectric layer is typically in a range of 25 Å–100 Å. The semiconductor layer 68 is typically polycrystalline silicon or amorphous silicon, and has a thickness in a range of approximately 1000 Å–3000 Å. An implant masking layer is then formed over the substrate and patterned to form masking member 64 that covers the peripheral portion of the semiconductor device. The memory array portion 202 is implanted as illustrated by arrows 66. The implant is typically performed using phosphorous ions ($P^+_{31}$) to a dose in a range of 1E15 to 1.5E16 ions per square centimeter. This should be performed at a relatively low energy to prevent significant penetration of ions through the gate dielectric layer 60. After the implantation of the semiconductor layer 68 within the memory array portion 202 the masking member 64 is removed from the substrate. As illustrated in FIG. 7 the semiconductor layer 68 has now been doped to become an N+ doped semiconductor layer 72 within the memory array portion 202 whereas the semiconductor layer 68 remains essentially undoped over the peripheral portion 204. An insulating capping layer 74 is then deposited and patterned such that the capping layer 74 only overlies regions of the memory array portion 202. The insulated capping layer 74 is removed from over the semiconductor layer 68 for all the peripheral portion 204

The processing steps used to form the gate dielectric layer 60 and the semiconductor layer 68 typically will cause the prior implants to activate and diffuse to form N-well regions 624 and 628 and P-well regions 622 and 626. Although not illustrated, there may multiple regions within the well regions shown in FIG. 6. Still present within the N-well region 624 of the memory array portion 202 is the surface channel region 57.

Figure 8:
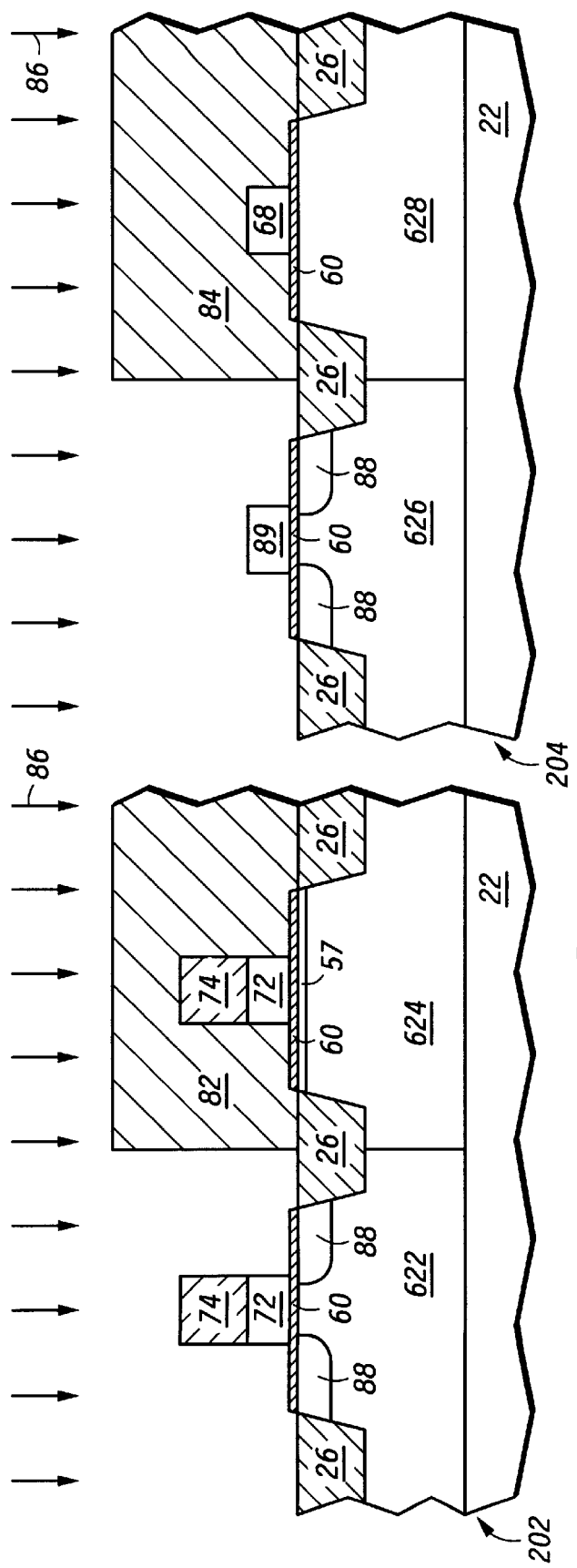
FIG. 8 includes an illustration of a cross-sectional view of the substrate of FIG. 7 after forming N+ source/drain regions.

The insulated capping layer 74 and the underlying semiconductor layers 72 and 68 are then patterned to form gate electrodes, as shown in FIG. 8. As shown, semiconductor layer 72 forms N-type gates. Further, a masking layer is then formed and patterned to create masking members 82 and 84. The masking members 82 and 84 overlie portions where P-channel transistors are formed for both the memory array portion 202 and the peripheral portion 204. An N+ implantation step is typically performed using ions of arsenic or antimony at an energy of approximately 10 to 80 kiloelectron volts to a dose in a range of approximately 1E15 to 5E15 ions per square centimeter. This doping step will form N+ doped regions 88 and also dopes a portion of the semiconductor layer to make an N+ doped electrode 89 (N-type gate) for the N-channel transistors within peripheral portion 204.

Figure 9:
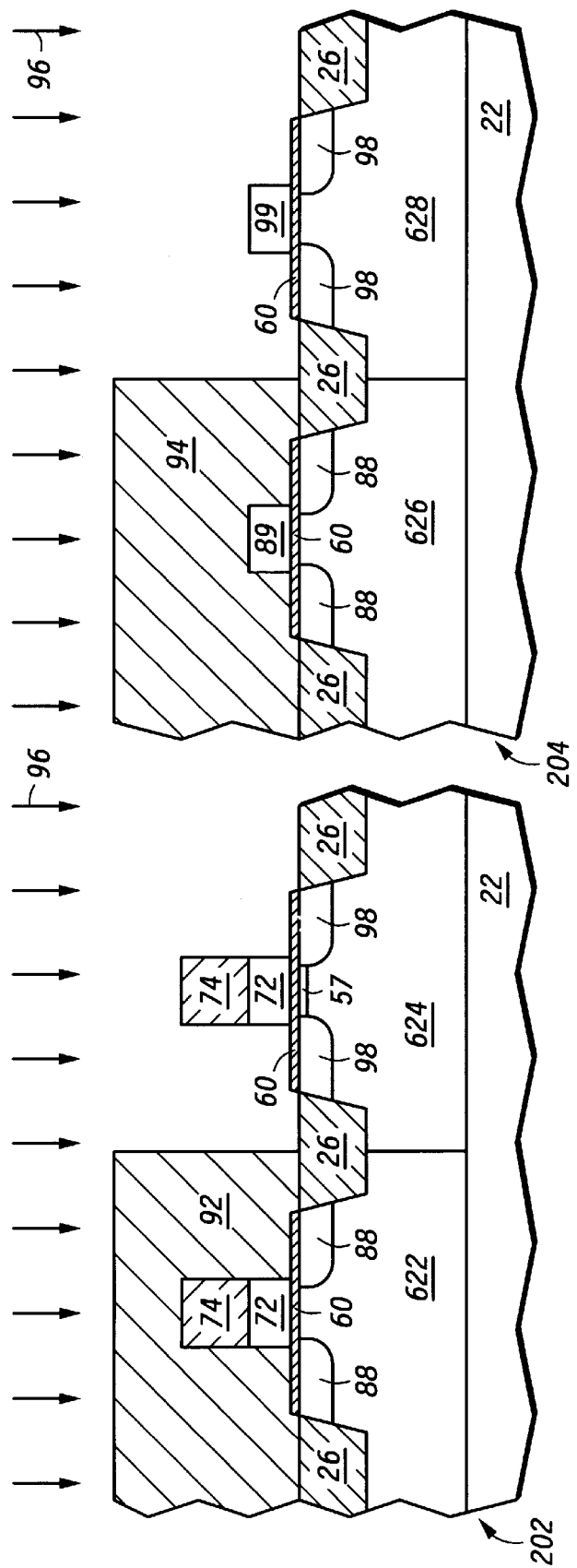
FIG. 9 includes an illustration of a cross-sectional view of the substrate of FIG. 8 after performing a P+ source/drain regions.

As shown in FIG. 9, a masking layer is then coated and patterned to form masking members 92 and 94 which overlie the N-channel transistors of the memory array portion 202 and the peripheral portion 204. Ion implantation is performed using boron ions or a boron-containing ions, such as boron difluoride ions ($BF_2^+$). The implantation is shown with arrows 96. This forms P+ doped regions 98 and also converts the undoped semiconductor layer to become P+ doped gate electrodes 99 (P-type gate) for the P-channel transistors within the peripheral portion 204.

At this point in processing of the semiconductor device, all N-channel transistors have N+ gate electrodes, and the P-channel transistors within the memory array portion 202 also have N+ gate electrodes. The P-channel transistors within the peripheral portion 204 have P+ gates. These doping characteristics are unlike the prior art devices. In many memory cells all gates are N+ doped meaning that all P-channel transistors are all buried channel transistors and all the N-channel transistors are surface channel transistors. In most logic applications all transistors including all N-channel and P-channel transistors are surface channel transistors. The significance of the unique combination of surface channel and buried channel transistors will become more apparent later when the electrical characteristics of the transistors are described.

Figure 10:
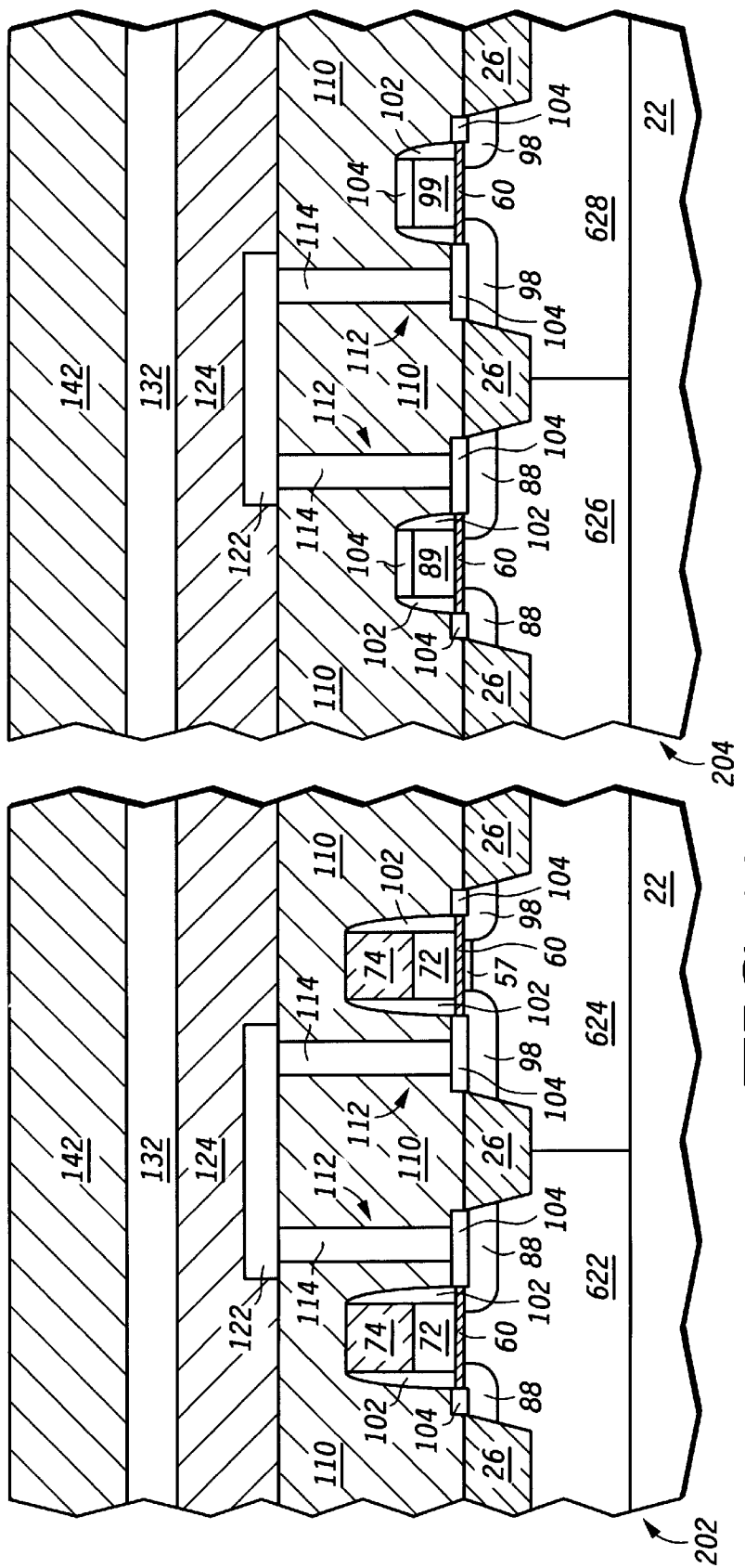
FIG. 10 includes an illustration of a cross sectional view of a substantially completed device.

Processing continues from a substantially completed semiconductor device. Spacers 102 are formed adjacent to the sides of the gate electrodes for both the memory array portion 202 and peripheral portion 204 as illustrated in FIG. 10. A self-aligned silicide process is then performed to silicide regions 104. An interlevel dielectric layer 110 is then formed over the memory array portion 202 and the peripheral portion 204. The interlevel dielectric layer 110 is patterned to form contact openings 112 that extend down to the silicide regions 104 for some of the portions of the semiconductor device. These contact openings 112 are then filled with a conductive material such as tungsten to form conductive plugs 114. Interconnects 122 are then formed over the first interlevel dielectric layer 110 and the conductive plugs 114 to electrically connect the regions as shown in FIG. 10. A second interlevel dielectric layer 124 is formed over the first level interconnects 122 that is subsequently followed by second level interconnects 132 that is covered by the passivation layer 142. Additional conductive plugs, vias and other electrical connections are made but are not illustrated within FIG. 10. Additionally, other interconnect levels and interlevel dielectric layers could be formed but are not illustrated in FIG. 10. In any event, the passivation layer 142 is formed over the uppermost interconnect level.

Figures 1, 11:
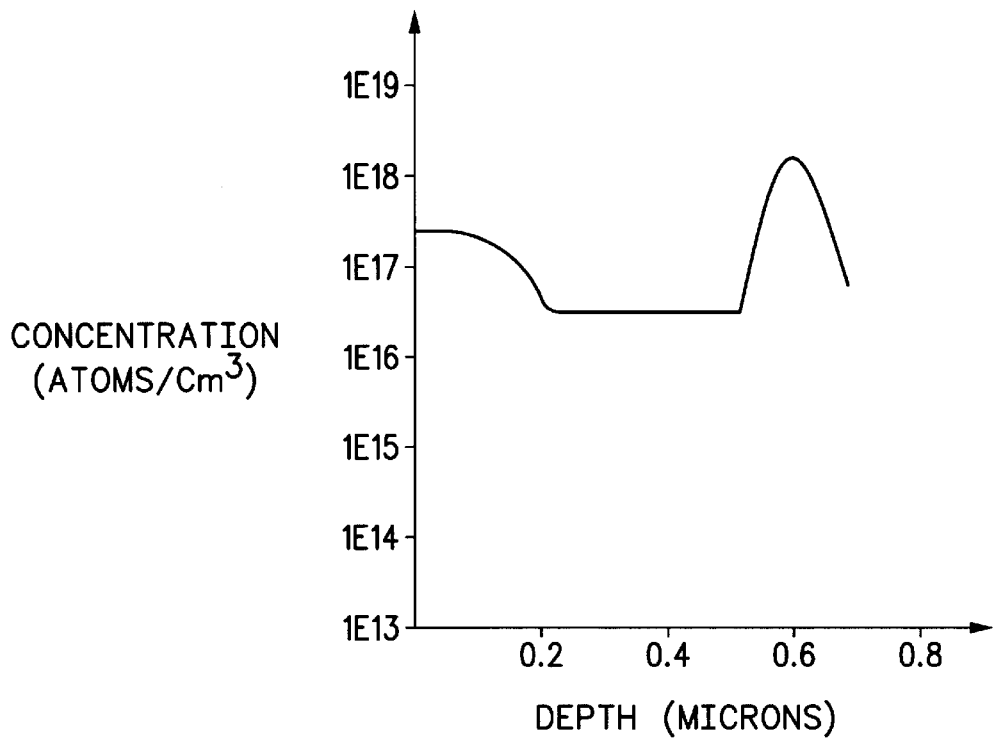
Figures 2, 11:
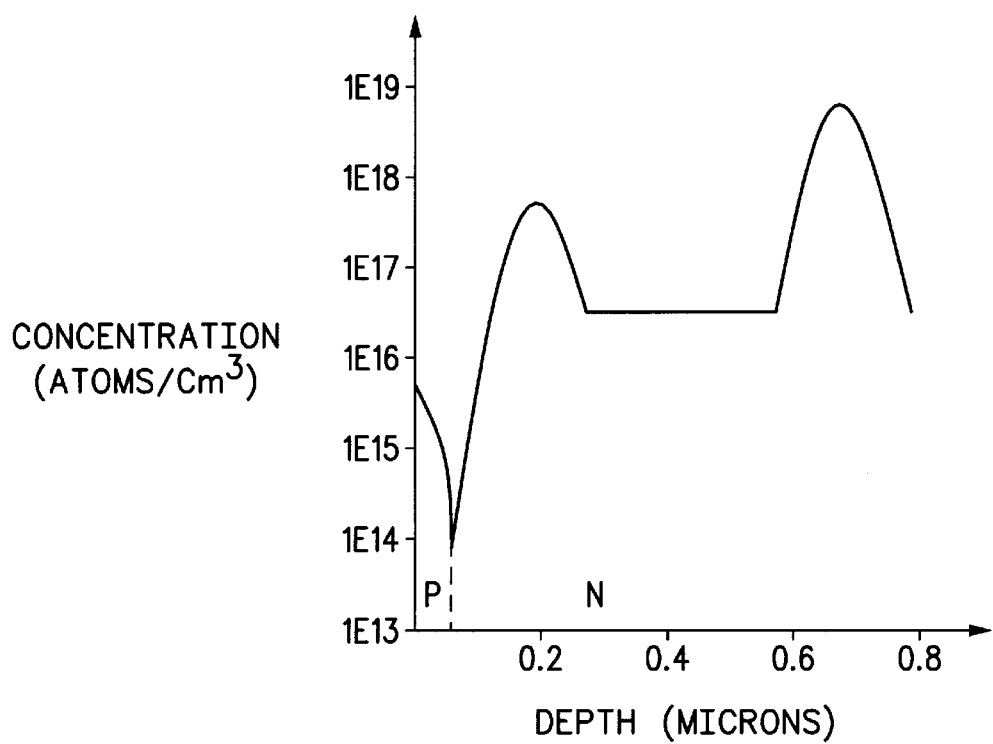

The device region doping profile formed by one embodiment of the present invention is illustrated in FIG. 11-1. As shown, the surface channel transistors include a device region that has a surface channel region, a background region, and a more conductive region. The surface channel region, near the primary surface, has a maximum concentration that is approximately 1E17 to 1E18 atoms per cubic cm. The depth of the maximum concentration of the surface channel region lies between the primary surface and approximately 0.2 microns below the primary surface. Underlying the surface channel region is a background region that typically has a maximum concentration in a range of 1E16 to 1E17 atoms per cubic cm. The depth of the maximum concentration of this region lies between 0.2 microns to 0.5 microns below the primary surface. Beyond this, a more conductive region has a maximum concentration in a range of approximately 1E18 to 1E19 atoms per cubic cm and lies along a region extending an additional 0.2 microns below the primary surface of the substrate. This profile applies to the N-channel and P-channel surface channel transistors.

For the buried channel transistors, such as the P-channel transistor of the memory array portion 202, a different device region is formed. Particularly, the device region includes a surface channel region, a punchthrough region, a background region, and a more conductive region. The surface channel region 57 lies near the top of the N-well region 624. Region 57 typically has a maximum concentration in a range of approximately 1E15 to 1E16 atoms per cubic cm at a depth no greater than approximately 0.1 micron. Additionally, there is also a punchthrough region that has a maximum concentration within a range of 1E17 to 1E18 atoms per cubic cm at approximately 0.1 to 0.3 microns below the primary surface. The balance of the profile is similar to that seen with the surface channel transistors. There is essentially a background region that has a maximum dopant concentration range of 1E16 to 1E17 atoms per cubic cm and a more conductive region that has a doping concentration of approximately 1E18 to 1E19 atoms per cubic cm at a depth of approximately 0.6 to 0.7 microns below the primary surface. Other than the surface channel region, the balance of the well region for the buried channel transistor is all N-type.

The present invention has a number of benefits over the prior art devices. More particularly, the present invention allows the formation of an SRAM cell where the P-channel transistors can be turned off harder to reduce leakage current through the P-channel transistors when they are off. This is achieved by the doping levels as previously described. The surface channel transistors within the device typically have a threshold of approximately 0.5 volts. The buried channel transistors have a threshold voltage closer to 0.9 volts. This increased threshold voltage for the buried channel transistors allow them to be shut off harder thereby have less leakage current when the P-channel transistors are turned off. Additionally, this semiconductor device operates almost as fast as an SRAM cell for a logic based semiconductor device (microcontroller). Surface channel transistors typically have lower threshold voltages meaning that they can be turned on faster. Therefore the present invention achieves the lower leakage characteristics of the buried channel transistor but also takes advantage of the faster access time associated with surface channel transistors. Because the access times within memory array are typically controlled by delays within peripheral portion, the access times for this device will be almost identical to those associated with a logic process flow. Any delays seen with this memory cell typically are no more than approximately 0.1 nanoseconds higher than they are with the prior art.

The implementation of this semiconductor device can be achieved using masking layers that are not critical. In other words, the misalignment tolerance seen with a P+ and N+ gates within the memory cell of a logic process flow will not occur. All the well region doping steps were uniquely required to form this device are non critical, meaning that misalignment tolerances are relatively large and the likelihood to having rework or forming a nonfunctional device are reduced.

Another advantage of the present invention is that it can be formed using present technology without the development of unusual process integration schemes or the use of exotic or unconventional materials. This allows the integration of the memory cell into a current fabrication facility without too much of an issue. In addition, the present invention allows for easy introduction of the insulating cap 74 above the gates in the array transistors. This facilitates introduction of self-aligned contacts that reduce memory cell area.

The present invention is being contemplated for use in devices having a VDD potential of 3.3 volts or less and at geometries of 0.3 microns or less. However it should be noted that the present invention may be used for larger dimension semiconductor devices should one desire.

What is claimed is:

1. A semiconductor device comprising:
   a substrate having a primary surface;
   a memory cell provided on the substrate, the memory cell including a P-channel transistor, the P-channel transistor having an N-type gate, wherein the P-channel transistor of the memory cell has a device region in the primary surface of the substrate, the device region including a surface channel region having a dopant concentration of less than 1E16 atoms per cubic cm at a depth no more than approximately 0.1 microns from the primary surface of the substrate, a punchthrough region having a maximum dopant concentration of 1E17 to 1E18 atoms per cubic cm at a depth within a range of 0.1 to 0.3 microns from the primary surface of the substrate, and a background region having a maximum dopant concentration of approximately 1E16 to 1E17 at a depth within a range of approximately 0.2 to 0.5 microns from the primary surface of the substrate; and a peripheral portion provided on the substrate, the peripheral portion including a P-channel transistor, the P-channel transistor having a P-type gate.

2. The semiconductor device of claim 1, wherein the memory cell further comprises an N-channel transistor, the N-channel transistor having an N-type gate, wherein the P-channel transistor of the peripheral portion has a device region in the primary surface of the substrate, the device region including a surface channel region having a mazimum dopant concentration of approximately 1E17 to 1E18 atoms per cubic cm at a depth from the primary surface to approximately 0.2 microns below the primary surface of the substrate, and a background region having a maximum dopant concentration of approximately 1E16 to 1E17 at a depth within a range of approximately 0.2 to 0.5 microns from the primary surface of the substrate.

3. The semiconductor device of claim 2, wherein the peripheral portion further comprises an N-channel transistor, the N-channel transistor having an N-type gate.

4. The semiconductor device of claim 3, wherein:
   each of the N-channel transistors of the memory cell and the N-channel transistor of the peripheral portion has a device region formed in the primary surface of the substrate, the device region including a surface channel region having a maximum dopant concentration of approximately 1E17 to 1E18 atoms per cubic cm at a depth from the primary surface to approximately 0.2 microns below the primary surface of the substrate, and a background region having a maximum dopant concentration of approximately 1E16 to 1E17 at a depth within a range of approximately 0.2 to 0.5 microns from the primary surface of the substrate.

5. The semiconductor device of claim 4, wherein the N-type gate of the P-channel transistor of the memory cell is doped with phosphorous and the N-type gate of the N-channel transistor of the peripheral portion is doped with arsenic.

6. The semiconductor device of claim 1, wherein the peripheral portion further comprises an N-channel transistor, the N-channel transistor having an N-type gate.

7. The semiconductor device of claim 1, wherein: the surface channel region of the P-channel transistor of the memory cell includes boron; the punchthrough region of the P-channel transistor of the memory cell includes antimony or arsenic; and the surface channel region of the P-channel transistor of the memory cell, the background region of the P-channel transistor of the memory cell, and the background region of the P-channel transistor of the peripheral portion include phosphorous.

8. A method of forming a semiconductor device comprising the steps of:
   providing a substrate having a primary surface;
   forming a memory cell provided on the substrate, the memory cell including a P-channel transistor, the P-channel transistor having a N-type gate, wherein:
   the P-channel transistor of the memory cell includes a device region in the primary surface of the substrate, the device region of P-channel transistor of the memory cell having a surface channel region and a punchthrough region;
   the surface channel region of the P-channel transistor of the memory cell is formed by implanting boron at a dose of approximately 1E12 to 1E13 ions per cm$^2$ at an energy of approximately 5 to 50 KeV; and
   the punchthrough region of the P-channel transistor of the memory cell is formed by implanting arsenic or antimony at a dose of approximately 1E12 to 1E13 ions per cm$^2$ at an energy of approximately 50 to 300 KeV; and
   forming a peripheral portion provided on the substrate, the peripheral portion including a P-channel transistor, the P-channel transistor having a P-type gate, wherein:
   the P-channel transistor of the peripheral portion includes a device region in the primary surface of the substrate, the device region of the P-channel transistor of the peripheral portion having a surface channel region; and
   the surface channel region of the P-channel transistor of the peripheral portion is formed by implanting phosphorous at a dose of approximately 1E12 to 1E13 ions per cm$^2$ at an energy of approximately 5 to 50 KeV.

9. The method of claim 8, wherein the step of forming the memory cell further includes providing an N-channel transistor, the N-channel transistor of the memory cell having an N-type gate, and the step of forming the peripheral portion further comprises providing an N-channel transistor, the N-channel transistor of the peripheral portion having an N-type gate.

10. The method of claim 9, wherein the N-type gate of P-channel transistor of the memory cell is doped with phosphorous prior to patterning, and the N-type gate of the N-channel transistor of the peripheral portion is doped with arsenic after patterning.

11. The method of claim 8, wherein the step of forming the memory cell further includes providing an N-channel transistor, the N-channel transistor of the memory cell having an N-type gate, the step of forming the peripheral portion further comprises providing an N-channel transistor, the N-channel transistor of the peripheral portion having an N-type gate, wherein the N-channel transistor of the memory cell and the N-channel transistor of the peripheral portion each include a device region that includes a surface channel region, wherein the surface channel region of the N-channel transistor of the memory cell and the surface channel region of the peripheral portion are formed by implanting boron at a dose of approximately 1E12 to 1E13 ions per cm$^2$ at an energy of approximately 5 to 50 KeV.

* * * * *